United States Patent
Hu

(10) Patent No.: US 10,622,445 B2
(45) Date of Patent: Apr. 14, 2020

(54) EPITAXIAL STRUCTURE OF TRENCH MOSFET DEVICES

(71) Applicant: Hunteck Semiconductor (Shanghai) Co., Ltd., Shanghai (CN)

(72) Inventor: Jun Hu, San Bruno, CA (US)

(73) Assignee: HUNTECK SEMICONDUCTOR (SHANGHAI) CO. Ltd., Shanghai (CN)

( * ) Notice: Subject to any disclaimer, the term of this patent is extended or adjusted under 35 U.S.C. 154(b) by 0 days.

(21) Appl. No.: 16/109,468

(22) Filed: Aug. 22, 2018

(65) Prior Publication Data

US 2019/0067469 A1    Feb. 28, 2019

(30) Foreign Application Priority Data

Aug. 23, 2017    (CN) .......................... 2017 1 0730195

(51) Int. Cl.
| | |
|---|---|
| H01L 29/08 | (2006.01) |
| H01L 29/78 | (2006.01) |
| H01L 29/40 | (2006.01) |
| H01L 29/10 | (2006.01) |
| H01L 29/66 | (2006.01) |
| H01L 29/06 | (2006.01) |

(52) U.S. Cl.
CPC ...... *H01L 29/0878* (2013.01); *H01L 29/0607* (2013.01); *H01L 29/0611* (2013.01); *H01L 29/0615* (2013.01); *H01L 29/1045* (2013.01); *H01L 29/407* (2013.01); *H01L 29/66477* (2013.01); *H01L 29/66666* (2013.01); *H01L 29/66712* (2013.01); *H01L 29/7813* (2013.01); *H01L 29/7827* (2013.01)

(58) Field of Classification Search
CPC ......... H01L 29/66477; H01L 29/66666; H01L 29/66712; H01L 29/0607; H01L 29/0611; H01L 29/0615; H01L 29/7813; H01L 29/7827; H01L 29/0878; H01L 29/1045
See application file for complete search history.

(56) References Cited

U.S. PATENT DOCUMENTS

| | | | |
|---|---|---|---|
| 9,525,059 B1* | 12/2016 | Kobayashi | H01L 29/7813 |
| 2009/0050960 A1* | 2/2009 | Pattanayak | H01L 29/407 257/334 |
| 2012/0037983 A1* | 2/2012 | Hshieh | H01L 27/0629 257/334 |
| 2017/0012118 A1* | 1/2017 | Park | H01L 29/7802 |

\* cited by examiner

*Primary Examiner* — Feifei Yeung Lopez
(74) *Attorney, Agent, or Firm* — Bo-In Lin

(57) ABSTRACT

This invention discloses a metal oxide semiconductor field effect transistor (MOSFET) device. The MOSFET device has a semiconductor substrate that supports an epitaxial layer thereon. The epitaxial layer comprises at least three layers of different dopant concentrations and wherein a middle epitaxial layer having a varying dopant concentration profile along an upward vertical direction.

17 Claims, 10 Drawing Sheets

EPITAXIAL STRUCTURE OF TRENCH MOSFET DEVICES

FIELD OF THE INVENTION

The invention relates generally to semiconductor power devices. More particularly, this invention relates to new configurations and methods for manufacturing the metal oxide semiconductor field effect transistor (MOSFET) devices with new epitaxial structure to improve the device performances.

DESCRIPTION OF THE RELATED ART

The metal oxide semiconductor field effect transistor (MOSFET) includes a conductive gate padded by a gate oxide layer and the operation of the MOSFETs is controlled through the filed effects by changing the voltages applied to the gate. Since the MOSFETs are commonly implemented in electronic apparatuses built with digital as well as analog circuits, there are great demands to continuously shrink the size of the MOFETs with the improvement of integrated circuit (IC) manufacturing technologies. Especially, by fabricating high density trench MOSFETs on epitaxial layers grown on monocrystalline semiconductor substrate, the pitch of circuits is further reduced.

Conventional trench MOSFETs are normally formed on a single or a double epitaxial-layer structure supported on a semiconductor substrate. As the pitches of become smaller and trenches deeper, the conventional trench MOSFETs formed on a single epitaxial layer or double epitaxial layers confront the difficulties to further improve the device performance to achieve a better breakdown voltage capability, a lower conductivity resistance, a stronger ruggedness and so on. For the above reasons, there is a need to provide new device configurations for the trench MOSFET power devices to overcome the above discussed difficulties and limitations.

SUMMARY OF THE PRESENT INVENTION

It is an aspect of this invention to provide new and improved MOSFETs wherein the new epitaxial layers are formed with gradually varying dopant concentrations along the vertical direction of the epitaxial layer extended from the surface of the bottom substrate toward the surface of the top epitaxial layer. In one embodiment, the dopant concentration of the epitaxial layer is gradually increased then gradually decreased along the upward vertical direction.

It is an aspect of this invention to provide new and improved MOSFETs wherein the new epitaxial layers are formed with a first, second and third epitaxial layers. The maximum dopant concentration of the second epitaxial layer is greater than the first epitaxial layer below the second epitaxial layer and also greater than the third epitaxial layer above the second epitaxial layer.

Another aspect of the present invention is to provide new and improved MOSFETs wherein the new epitaxial layers are formed with a first, second and third epitaxial layers. The first and third epitaxial layers have a first layer uniform dopant concentration and a third layer uniform dopant concentration respectfully. The second epitaxial layer further comprises a plurality of sub-layers and each sub-layer has a different dopant concentration. The maximum dopant concentrations of the sub-layers in the second epitaxial layer are greater than the first epitaxial layer beneath the second epitaxial layer and also greater than the third epitaxial layer above the second epitaxial layer.

Another aspect of the present invention is to provide new and improved MOSFETs wherein the second epitaxial layer is formed with a plurality of sub-layers mentioned above. In one embodiment to form the sub-layers of the second epitaxial layer, the dopant concentrations of the sub-layers are gradually increased from the dopant concentration of the first epitaxial layer to a maximum and then gradually decreased to the dopant concentration of the third epitaxial layer along the upward vertical direction. In another embodiment, the dopant concentrations of the sub-layers is gradually increased to a maximum to form a plateau with the maximum dopant concentration and then gradually decreased along the upward vertical direction.

It is another aspect that in a preferred embodiment, the present invention is to provide new and improved MOSFETs wherein the new epitaxial layers are formed with a first, second and third epitaxial layers. The first epitaxial layer has a top surface below the bottom of the trench. The bottom of the trench is disposed vertically at a lower portion of the second epitaxial layer. The bottom surface of the third epitaxial layer is disposed vertically below the bottom surface of the upper trench gate segment.

Another aspect of the present invention is to provide new and improved MOSFETs wherein the new epitaxial layers are formed with a first, second and third epitaxial layers. The first epitaxial layers has a uniform dopant concentration and the third epitaxial layer has a gradually decreasing dopant concentration along the upward vertical direction. The second epitaxial layer further comprises a plurality of sub-layers and each sub-layers has different dopant concentrations. The maximum dopant concentrations of the sub-layers in the second epitaxial layer are greater the first epitaxial layer above the second epitaxial layer also greater than the third epitaxial layer above the second epitaxial layer.

Another aspect of the present invention is to provide new and improved MOSFETs wherein the second epitaxial layer is formed with a plurality of sub-layers. In one embodiment to form the sub-layers of the second epitaxial layer, the dopant concentrations of the sub-layers are gradually increased along the upward vertical direction from the dopant concentration of the first epitaxial layer to the dopant concentration of the third epitaxial layer at the top surface of the second epitaxial layer. In another embodiment, the dopant concentrations of the sub-layers is gradually increased along the upward vertical direction to the dopant concentration of the third epitaxial layer to form a plateau with the dopant concentration of the third epitaxial layer.

Another aspect of the present invention is to provide new and improved MOSFETs wherein the new epitaxial layers are formed with a first, second and third epitaxial layers. The first and third epitaxial layers have a first layer uniform dopant concentration and a third uniform layer dopant concentration respectfully. In one embodiment, the second epitaxial layer has a gradually increasing dopant concentration along upward vertical direction. The dopant concentration at the bottom of the second epitaxial layer is greater than the first layer uniform dopant concentration and the dopant concentration at the top surface of the second epitaxial layer is greater the third epitaxial layer uniform dopant concentration. In another embodiment, the second epitaxial layer has a uniform dopant concentration greater than the dopent concentrations of the first epitaxial layer and the third epitaxial layer.

Another aspect of the present invention is to provide new and improved MOSFETs wherein the new epitaxial layers are formed with a first, second and third epitaxial layers. The first and third epitaxial layers have a first layer uniform dopant concentration and a third uniform layer dopant concentration respectfully. The first epitaxial layer uniform dopant concentration is lower than the third epitaxial layer uniform dopant concentration. The top surface of the first epitaxial layer is located above the bottom of the trench. The trench penetrates the second and the third epitaxial layers vertically and the bottom of the trench is located in the first epitaxial layer. The bottom surface of the third epitaxial layer is disposed vertically below the bottom surface of the trench gate poly silicon.

Therefore, this invention overcomes the limitations and difficulties of the conventional technologies by providing new and improved MOSFETs with a new epitaxial layer structure. The epitaxial layers are formed with combinations of different varying dopant concentrations along the vertical direction from the surface of the silicon substrate to the top surface of the top epitaxial layer. The improved MOSFETs of this invention achieve a higher breakdown voltage (BV), a lower turning-on resistance (Rdson) and an improved ruggedness.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

For the purpose of clearly describing and explaining the invention, many preferred embodiments are described with accompanying drawings listed below. The benefits and advantages of the new and improved device will become significantly clearer after reviewing the descriptions together with the drawings provided below:

FIG. 5 shows the dopant concentration variations along the vertical direction of a MOSFET as another preferred embodiment of this invention with new and improved epitaxial structures.

DETAILED DESCRIPTION OF THE PREFERRED EMBODIMENTS

The details of the present invention are described below with drawings to more clearly explain the technical features and advantages of this invention.

Figure 1:
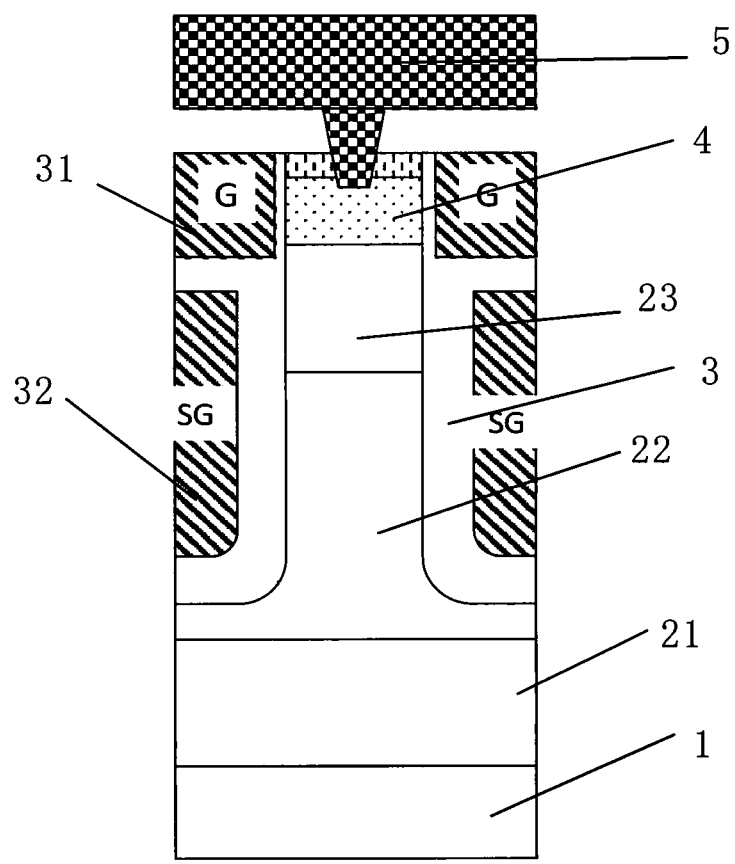
FIG. 1 is a cross sectional view of a MOSFET of this invention with new and improved epitaxial structures.

FIG. 1 is a cross sectional view of a trench metal oxide semiconductor field effect transistor (MOSFET). According to the conductivity types of the current channels, the MOSFET as shown can be either a P type trench MOSFET or an N-type trench MOFET device. Specifically, MOSFETs have two major transistor types, depletion mode and enhancement mode, corresponding to whether the transistor is in an on-state or an off-state when the gate to source voltage is zero.

The embodiment described below is an N-channel MOSFET wherein the current conducting is carried out in an enhancement. The embodiment is only an example; the invention can be equally applied to form a P-type channel MOSFET. Specifically, in FIG. 1, the bottom substrate layer 1 is formed as a silicon layer to support the epitaxial layer 2 above the bottom layer. The MOSFET includes a plurality of trench gates 3 shown on either sides of epitaxial layer. A body region 4 is formed between the trenches wherein the body region further encompassed the source region that is electrically connected to the source metal 5. The bottom substrate layer 1, the body region 4 and the epitaxial layers as shown can be formed with different types of semiconductor materials. More particularly, the epitaxial layers that will be further described below may be silicon layers doped with different dopants such as boron, phosphates, arsenic.

More specifically, the dopant concentration of the epitaxial layer along a vertical upward direction is gradually increased and then gradually decreased after reaching a maximum dopant concentration. Furthermore, the thickness of the epitaxial layer can also be adjusted according to the requirements of different device applications. Furthermore, the thickness of the epitaxial layer 2 can be flexible adjusted according to different device performance requirements. Additionally, the epitaxial layer can be divided into a plurality of sublayers doped with different dopant concentrations. In a preferred embodiment, the epitaxial layer comprises at least three layers wherein the middle layer, i.e., the second layer, has a highest dopant concentration and the bottom and top epitaxial layers have lower dopant concentrations than the middle layer. In another preferred embodiment, the top layer, i.e., the third epitaxial layer has a higher dopant concentration than the bottom epitaxial layer, i.e., the first epitaxial layer. These different embodiments will be further described below.

Referring to FIG. 1 again, the trench gate 3 includes a top gate segment 31 and a bottom shielding gate segment 32(SG) formed by polysilicon. This split-gate MOSFET structure is used to reduce the gate-drain capacitance and to improve the breakdown voltage capability. Along an upward vertical direction, the dopant concentration of the epitaxial layer is gradually increased and then gradually decreased after a predesignated maximum dopant concentration is reached somewhere in the middle of the epitaxial layer. Specifically, the epitaxial layer comprises the first epitaxial layer 21, the second epitaxial layer 22 and the third epitaxial layer 23 wherein the second epitaxial layer 22 has a higher dopant concentration than the first and third epitaxial layers. The bottom surface of the trench gate is disposed vertically at a lower portion of the second epitaxial layer 22. The dopant concentration of the second epitaxial layer 22 reaches a highest value somewhere in the upper portion of the layer 22 and then gradually decreasing along the upward direction extending toward the third epitaxial layer 23. The dopant concentration decrease of the second layer 22 after maximum along upward direction can be either a gradual decrease or a sudden quantum drop. In a preferred embodiment, the dopant concentration at the bottom of the third layer 23 is lower than the highest dopant concentration of the second epitaxial layer 22.

Figure 2:
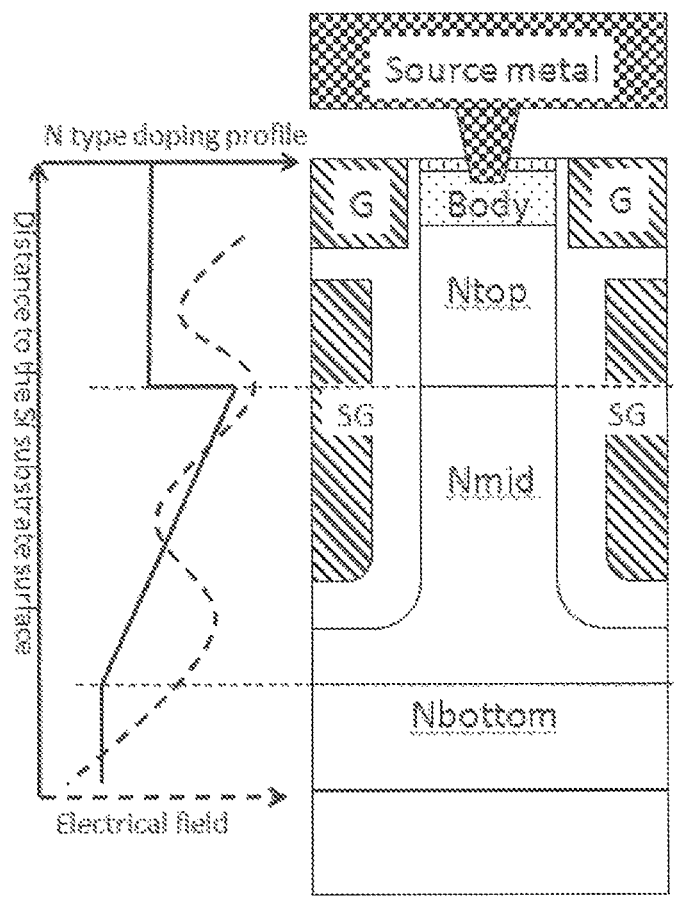
FIG. 2 is a cross sectional view of a MOSFET as a preferred embodiment of this invention with new and improved epitaxial structures wherein the dopant concentration variations are depicted along the vertical direction besides the cross sectional view of the MOSFET.

FIG. 2 shows another preferred embodiment wherein the dopant concentration variations in the epitaxial layers are illustrated. By referring to FIGS. 1 and 2, the dopant concentration of the bottom layer, i.e., layer 21 has a uniform concentration and the dopant concentration has the lowest value. The dopant concentration at the bottom surface of the second layer 22 is the same as the first layer 21 and gradually increased in a linear fashion along the upward direction until the top surface of the second epitaxial layer. The top epitaxial layer 23 has a uniform dopant concentration that is significantly lower than the highest dopant concentration of the second epitaxial layer 22. The bottom of the trench gate 3 is disposed vertically at a lower portion of the second epitaxial layer 22.

According to the embodiments described above, the MOSFETs comprises at least three epitaxial layers with varying dopant concentrations as shown. Such epitaxial layer structures, in combination with the relative position of the split-gate trench, can further improve the MOSFET performance especially when the high density deep trench structure is used. The high density deep trenches enhance the shielding effect of the shielding gate segment 32. Therefore the new MOSFETs in the present invention with a higher dopant concentration of the epitaxial layers between trenches have a same or higher breakdown voltage and a lower Rdson than the conventional trench MOSFETs with a single or a double epitaxial-layer structure. Moreover, with a relatively lower dopant concentration of the third epitaxial layer 23, the P-body can be formed with a relatively lower P-dopant concentration to achieve a desirable threshold voltage. Therefore, the electrical field near the PN junction of the body regions is reduced under reverse bias of the MOSFET and that further improves the unclamped inductive switch capability (UIS).

Figure 3:
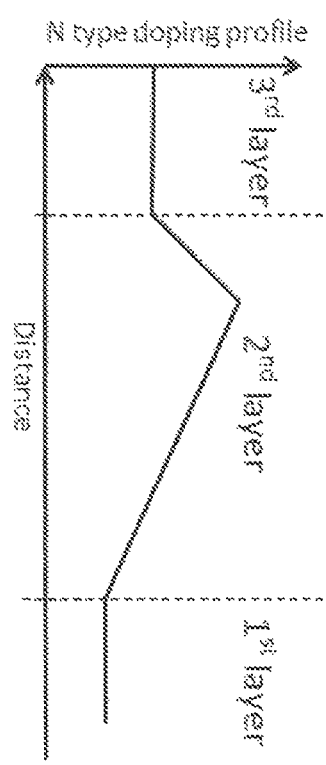
FIG. 3 shows the dopant concentration variations along the vertical direction of a MOSFET as another preferred embodiment of this invention with new and improved epitaxial structures.
Figure 4:
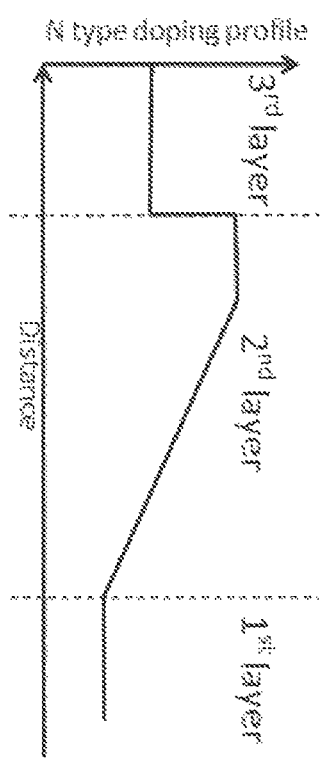
FIG. 4 shows the dopant concentration variations along the vertical direction of a MOSFET as another preferred embodiment of this invention with new and improved epitaxial structures.

FIGS. 3 to 5 show additional preferred embodiments of this invention wherein different dopant concentration variations in the epitaxial layers are shown. The device structures shown in FIGS. 3 to 5 are basically the same as that shown in FIGS. 1 and 2. The middle epitaxial layer is formed with different variations of dopant concentrations while the first and third epitaxial layers 21 and 23 are doped with uniform dopant concentrations. The first epitaxial layer 21 has a lower dopant concentration than the third epitaxial layer while the dopant concentrations of the second epitaxial layer are higher than that of the first and third epitaxial layer.

FIG. 3 shows the dopant concentration variations in the epitaxial layers. The first and third epitaxial layers 21 and 23 are doped with uniform dopant concentrations. The first epitaxial layer 21 has a lower dopant concentration than the third epitaxial layer. Starting from the bottom of the layer, the middle epitaxial layer is formed with a linearly increasing dopant concentration with reduced depth. The linearly increased dopant concentration reach a maximum value near the upper portion of the second layer 22, the dopant concentration starts to linearly decrease until reached to bottom of the third epitaxial layer where the dopant concentration is the same as the uniform dopant concentration of the third epitaxial layer. The dopant concentration at the bottom of the second epitaxial layer is the same as the uniform dopant concentration of the first epitaxial layer.

FIG. 4 shows the dopant concentration variations in the epitaxial layers as an alternate embodiment of the device shown in FIG. 3. The first and third epitaxial layers 21 and 23 are doped with uniform dopant concentrations. The first epitaxial layer 21 has a lower dopant concentration than the third epitaxial layer. Starting from the bottom of the layer, the middle epitaxial layer is formed with a linearly increasing dopant concentration with reduced depth. The linearly increased dopant concentration reach a maximum value near the upper portion of the second layer 22, the dopant concentration and continues to maintain the maximum dopant concentration until reached to bottom of the first epitaxial layer where the dopant concentration is reduced the same as the uniform dopant concentration of the third epitaxial layer. The dopant concentration at the bottom of the second epitaxial layer is the same as the uniform dopant concentration of the first epitaxial layer.

FIG. 5 shows the dopant concentration variations in the epitaxial layers as an alternate embodiment of the device shown in FIG. 3. The first and third epitaxial layers 21 and 23 are doped with uniform dopant concentrations with the first epitaxial layer 21 has a lower dopant concentration than the third epitaxial layer. Starting from the bottom of the layer, the middle epitaxial layer is formed with a linearly increasing dopant concentration with reduced depth. The linearly increased dopant concentration reach a maximum value near the upper portion of the second layer 22, the dopant concentration and continues to maintain the maximum dopant concentration until reached a certain depth below the bottom of the first epitaxial layer. Then, the dopant concentration of the second epitaxial layer linear decreased with reduced depth until it reaches the bottom of the third epitaxial layer where the dopant concentration is the same as the uniform dopant concentration of the third epitaxial layer. The dopant concentration at the bottom of the second epitaxial layer is the same as the uniform dopant concentration of the first epitaxial layer.

According to FIGS. 1 to 5, the top surface of the first epitaxial layer 21 is below the bottom of the trench 3. The bottom of the trench is vertically disposed near the bottom portion of the second epitaxial layer 22 while the bottom surface of the third epitaxial layer 23 is vertically disposed below the bottom surface of the upper gate segment 31.

Figure 6:
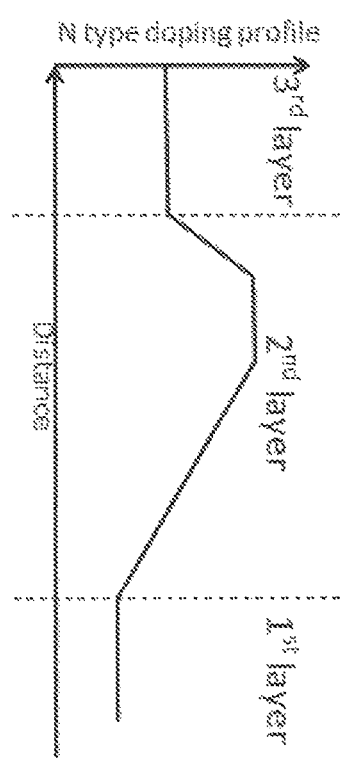
FIG. 6 shows the dopant concentration variations along the vertical direction of a MOSFET as another preferred embodiment of this invention with new and improved epitaxial structures.
Figure 6:
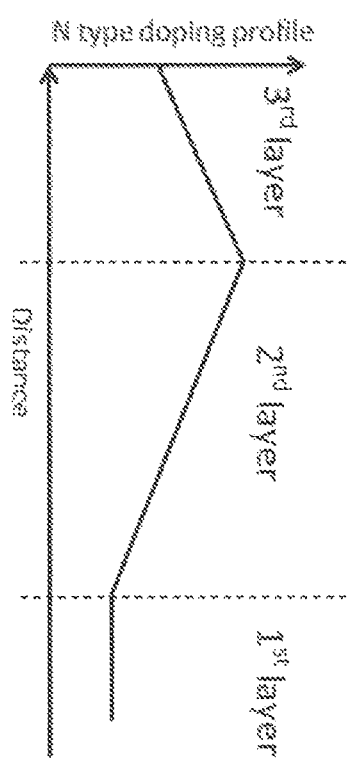
Figure 7:
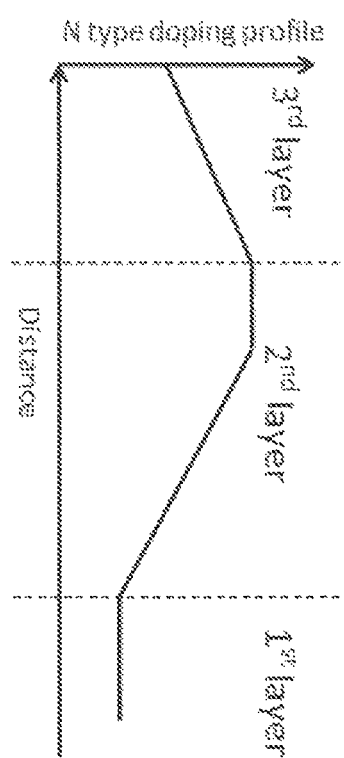
FIG. 7 shows the dopant concentration variations along the vertical direction of a MOSFET as another preferred embodiment of this invention with new and improved epitaxial structures.

FIGS. 6 to 7 show additional preferred embodiments of this invention wherein different dopant concentration variations in the epitaxial layers are shown. The dopant concentration variations of the first and third epitaxial layers are the same as that shown in FIGS. 6 and 7. Specifically, the second epitaxial layer includes a plurality of sub-layers wherein the dopant concentration for each sub-layer is different. The dopant concentration of the first epitaxial layer 21, i.e., the bottom epitaxial layer is uniform while the dopant concentration of the third epitaxial layer 23, i.e., the top epitaxial layer is linearly decreased with reduced depth and the second epitaxial layer 22 has a higher dopant concentration than that of the first and third epitaxial layers.

FIG. 6 shows the dopant concentration variations in the epitaxial layers. The dopant concentration of the second epitaxial layer is linearly increased with reduced depth until it reached the bottom of the third epitaxial layer. At the bottom of the third epitaxial layer, the dopant concentration of the second and third epitaxial layer is the same and the dopant concentration of the third epitaxial layer starts to linearly decrease with reduced depth.

FIG. 7 shows the dopant concentration variations in the epitaxial layers. The dopant concentration of the second epitaxial layer 22 is linearly increased with reduced depth until it reached a predesignated maximum value near the top portion of the second epitaxial layer. Then, the dopant concentration is maintained constant until it reaches the bottom of the third epitaxial layer 23. At the bottom of the third epitaxial layer, the dopant concentration of the second and third epitaxial layer is the same and the dopant concentration of the third epitaxial layer starts to linearly decrease with reduced depth.

According to FIGS. 1, 6 and 7, the top surface of the first epitaxial layer 21 is below the bottom of the trench 3. The bottom of the trench is vertically disposed near the bottom portion of the second epitaxial layer 22 while the bottom surface of the first epitaxial layer 21 is vertically disposed below the bottom surface of the upper gate segment 31.

Figure 8:
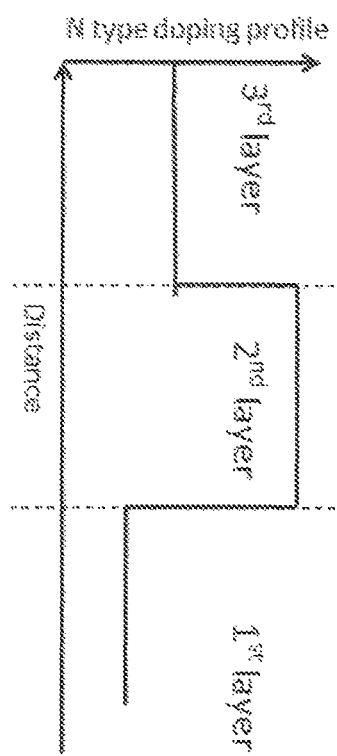
FIG. 8 shows the dopant concentration variations along the vertical direction of a MOSFET as another preferred embodiment of this invention with new and improved epitaxial structures.
Figure 9:
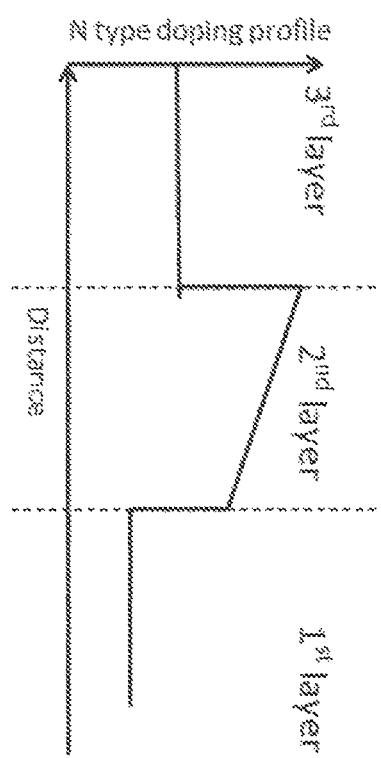
FIG. 9 shows the dopant concentration variations along the vertical direction of a MOSFET as another preferred embodiment of this invention with new and improved epitaxial structures.
Figure 10:
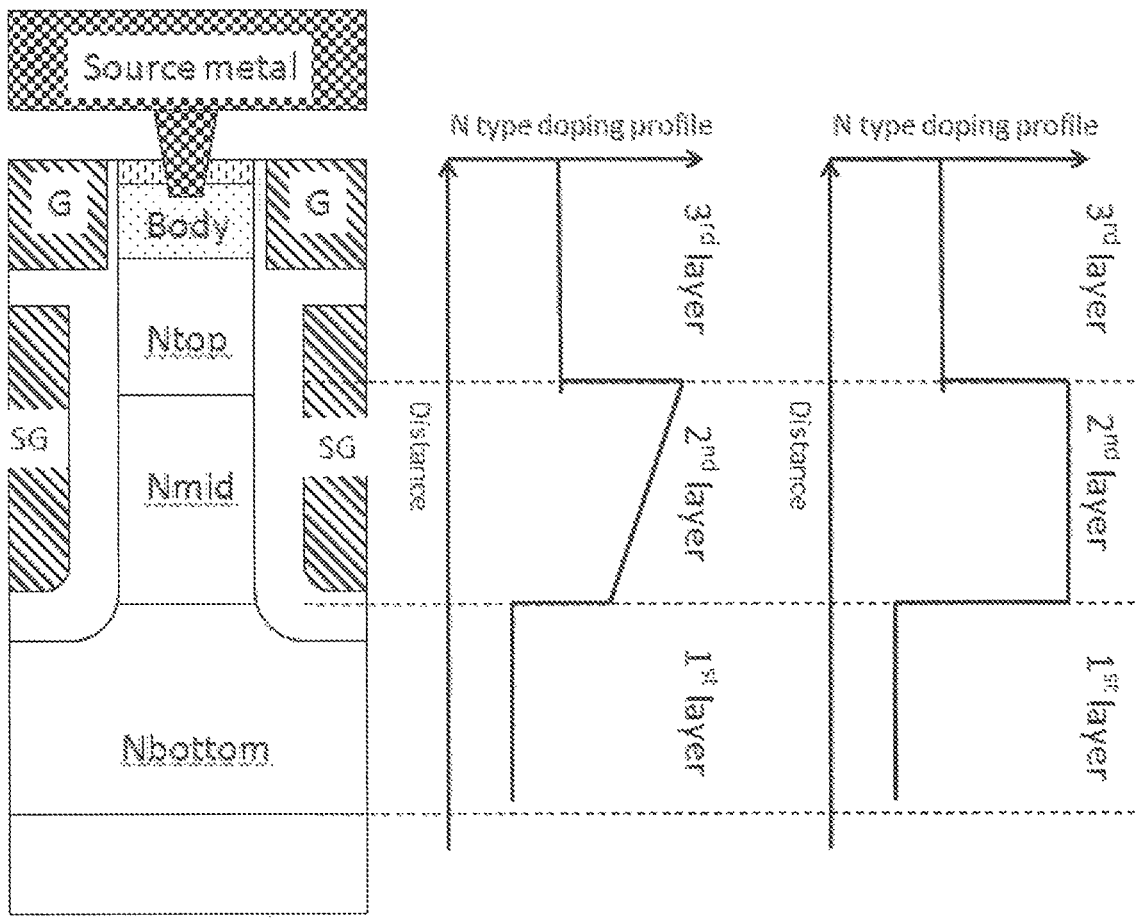
FIG. 10 is a cross sectional view of a MOSFET as another preferred embodiment of this invention with new and improved epitaxial structures wherein two different dopant concentration variations are depicted in FIG. 8 and FIG. 9 along the vertical direction besides the cross sectional view of the MOSFET.

FIGS. 8 to 9 show additional preferred embodiments of this invention wherein different dopant concentration variations in the epitaxial layers are shown. The uniform dopant concentrations of the first and third epitaxial layers shown in FIG. 8 are the same as that shown in FIG. 9. Specifically, the second epitaxial layer 22 has a greater dopant concentration than the dopant concentrations of the first and third epitaxial layer. The dopant concentration of the first epitaxial layer, i.e., the bottom epitaxial layer is uniform while the dopant concentration of the third epitaxial layer, i.e., the top epitaxial layer is also uniform wherein the dopant concentration of the first epitaxial layer is smaller than that of the third epitaxial layer. As shown in FIG. 8, the second epitaxial layer has a higher dopant concentration than the first and the third epitaxial layers at the bottom surface of the second epitaxial layer and maintains a constant value with reduced depth until it reaches the bottom surface of the third epitaxial layer. As that shown in FIG. 9, the dopant concentration of the second epitaxial layer has a higher dopant concentration than the first epitaxial layer at the bottom surface of the second epitaxial layer and linearly increased with reduced depth until it reaches the bottom of the third epitaxial layer with a maximum dopant concentration that is higher than the dopant concentration of the third epitaxial layer.

According to FIGS. 8 and 9, the top surface of the first epitaxial layer 21 is above the bottom of the trench 3. The bottom of the trench is vertically disposed in the first epitaxial layer 21 while the bottom surface of the third epitaxial layer 23 is vertically disposed below the bottom surface of the upper gate segment 31. With the dopant concentration profiles shown in the FIGS. 8 and 9, the MOSFET trench 3 must penetrates the second and third epitaxial layers and the bottom of the trench is located in the first epitaxial layer. Therefore the trench can provide efficient shielding to the mobile carriers under the reverse bias and the device can achieve the optimized BV-Rdson tradeoff.

According to above descriptions, the embodiments can also be implemented as P-channel MOSFETs. The scopes of this invention are not limited by the specific embodiments described above. Different variations and modifications may be carried out by those of ordinary skilled in the art.

Although the present invention has been described in terms of the presently preferred embodiment, it is to be understood that such disclosure is not to be interpreted as limiting. For example, though the conductivity types in the examples above often show an n-channel device, the invention can also be applied to p-channel devices by reversing the polarities of the conductivity types. Various alterations and modifications will no doubt become apparent to those skilled in the art after reading the above disclosure. Accordingly, it is intended that the appended claims be interpreted as covering all alterations and modifications as fall within the true spirit and scope of the invention.

I claim:

1. A metal oxide semiconductor field effect transistor (MOSFET) device comprising:
   a semiconductor substrate supports an epitaxial layer thereon wherein the epitaxial layer comprises at least three layers of different dopant concentrations and wherein a middle epitaxial layer having a varying dopant concentration profile along an upward vertical direction; and
   the middle epitaxial layer with the varying dopant concentration profile has a maximum dopant concentration that is higher than a dopant concentration of a bottom epitaxial layer and a top epitaxial layer and the bottom epitaxial layer has a uniform dopant concentration that is lower than the dopant concentration of the top epitaxial layer.

2. A metal oxide semiconductor field effect transistor (MOSFET) device comprising:
   a semiconductor substrate supports an epitaxial layer thereon wherein the epitaxial layer comprises at least three layers of different dopant concentrations and wherein a middle epitaxial layer having a varying dopant concentration profile along an upward vertical direction; and
   the middle epitaxial layer with the varying dopant concentration profile has a maximum dopant concentration that is higher than a dopant concentration of a bottom epitaxial layer and a top epitaxial layer and the bottom epitaxial layer and the top epitaxial layer have a bottom uniform dopant concentration and a top uniform dopant concentration respectfully wherein the bottom uniform dopant concentration is lower than the top uniform dopant concentration.

3. The MOSFET device of claim 1 further comprising:
   a plurality of trench gates filled with a conductive trench material; and
   a body region disposed between the trench gates disposed at a top portion of the top epitaxial layer have an opposite conductivity type than the top epitaxial layer and wherein the body region encompassed a source region disposed near a top surface and having a same conductivity type of the top epitaxial layer.

4. The MOSFET device of claim 3 wherein:
   the trench gates filled with the conductive trench material are split trench gates comprise an upper gate segment and a lower segment separated by an intermediate insulation layer and padded by a gate insulation layer disposed on trench walls and a bottom surface of the trench gates.

5. The MOSFET device of claim 4 further comprising:
   a top passivation layer covering over the trench gates, and the source region wherein the top passivation layer further includes a source contact trench filled with source contact metal to contact the source region and a source metal layer on top of the top passivation layer.

6. The MOSFET device of claim 1 wherein:
the epitaxial layers are N-type epitaxial layer and the MOSFET device is an N-channel MOSFET device.

7. The MOSFET device of claim 1 wherein:
the epitaxial layers are P-type epitaxial layer and the MOSFET device is a P-channel MOSFET device.

8. A metal oxide semiconductor field effect transistor (MOSFET) device comprising:
a semiconductor substrate supports an epitaxial layer thereon wherein the epitaxial layer comprises at least three layers of different dopant concentrations and wherein a middle epitaxial layer having a gradually increasing dopant concentration profile along an upward vertical direction until reaching a maximum dopant concentration;
the dopant concentration at the bottom surface of the middle epitaxial layer is the same as the dopant concentration at the top surface of the bottom epitaxial layer; and
the bottom epitaxial layer and the top epitaxial layer have a bottom uniform dopant concentration and a top uniform dopant concentration respectively and the bottom uniform dopant concentration is lower than the top uniform dopant concentration.

9. The MOSFET device of claim 8 wherein:
the maximum dopant concentration in middle epitaxial layer is higher than a dopant concentration of a bottom epitaxial layer and a top epitaxial layer.

10. The MOSFET device of claim 8 wherein:
the gradually increasing dopant concentration in the middle epitaxial layer has a linearly increasing dopant profile until the linearly increasing dopant profile reaches the maximum dopant concentration in an upper portion of the middle epitaxial layer.

11. The MOSFET device of claim 10 wherein:
the linearly increasing dopant profile in the middle epitaxial layer reaches the maximum dopant concentration in an upper portion of the middle epitaxial layer then the dopant concentration is gradually decreasing until reaching a top surface of the middle epitaxial layer.

12. A metal oxide semiconductor field effect transistor (MOSFET) device comprising:
a semiconductor substrate supports an epitaxial layer thereon wherein the epitaxial layer comprises at least three layers of different dopant concentrations and wherein a middle epitaxial layer having a gradually increasing dopant concentration profile along an upward vertical direction until reaching a maximum dopant concentration;
the dopant concentration at the bottom surface of the middle epitaxial layer is the same as the dopant concentration at the top surface of the bottom epitaxial layer;
the gradually increasing dopant concentration in the middle epitaxial layer has a linearly increasing dopant profile until the linearly increasing dopant profile reaches the maximum dopant concentration in an upper portion of the middle epitaxial layer; and
the linearly increasing dopant profile in the middle epitaxial layer reaches the maximum dopant concentration in an upper portion of the middle epitaxial layer then the dopant concentration maintains at the maximum dopant concentration until reaching a top surface of the middle epitaxial layer.

13. A metal oxide semiconductor field effect transistor (MOSFET) device comprising:
a semiconductor substrate supports an epitaxial layer thereon wherein the epitaxial layer comprises at least three layers of different dopant concentrations and wherein a middle epitaxial layer having a gradually increasing dopant concentration profile along an upward vertical direction until reaching a maximum dopant concentration;
the dopant concentration at the bottom surface of the middle epitaxial layer is the same as the dopant concentration at the top surface of the bottom epitaxial layer;
the gradually increasing dopant concentration in the middle epitaxial layer has a linearly increasing dopant profile until the linearly increasing dopant profile reaches the maximum dopant concentration in an upper portion of the middle epitaxial layer; and
the linearly increasing dopant profile in the middle epitaxial layer reaches the maximum dopant concentration in an upper portion of the middle epitaxial layer then the dopant concentration maintains at the maximum dopant concentration and then gradually decreases until reaching a top surface of the middle epitaxial layer.

14. A metal oxide semiconductor field effect transistor (MOSFET) device comprising:
a semiconductor substrate supports an epitaxial layer thereon wherein the epitaxial layer comprises at least three layers of different dopant concentrations and wherein a middle epitaxial layer having a gradually increasing dopant concentration profile along an upward vertical direction until reaching a maximum dopant concentration; the dopant concentration at the bottom surface of the middle epitaxial layer is the same as the dopant concentration at the top surface of the bottom epitaxial layer;
the maximum dopant concentration in middle epitaxial layer is higher than a dopant concentration of a bottom epitaxial layer and a top epitaxial layer;
the bottom epitaxial layer has a bottom uniform dopant concentration and the top epitaxial layer has a gradually decreasing top dopant concentration respectively and the bottom uniform dopant concentration is lower than the top gradually decreasing dopant concentration.

15. A metal oxide semiconductor field effect transistor (MOSFET) device comprising:
a semiconductor substrate supports an epitaxial layer thereon wherein the epitaxial layer comprises at least three layers of different dopant concentrations and wherein the bottom epitaxial layer and the top epitaxial layer have a bottom uniform dopant concentration and a top uniform dopant concentration respectively and the bottom uniform dopant concentration is lower than the top uniform dopant concentration; the dopant concentration at the bottom surface of the middle epitaxial layer is higher than the dopant concentration at the top surface of the bottom epitaxial layer; and
the middle epitaxial layer has a uniform dopant concentration higher than the dopant concentrations of a top epitaxial layer and a bottom epitaxial layer.

16. The MOSFET device of claim 15 wherein:
a plural of trench gates each having a trench bottom surface disposed below the bottom surface of the middle epitaxial layer; the bottom of the trenches is located in the bottom epitaxial layer; the bottom surface of the top epitaxial layer is below the bottom surface of an upper gate segment of the split trench gates in the trenches.

17. The MOSFET device of claim 8 further comprising: a plural of trench gates each having a trench bottom surface disposed above the bottom surface of the middle epitaxial layer; the bottom of the trenches is located in the lower portion of the middle epitaxial layer; the bottom surface of the top epitaxial layer is below the bottom surface of an upper gate segment of the split trench gates in the trenches.

* * * * *